(12) United States Patent
Fudaba et al.

(10) Patent No.: US 8,655,289 B2
(45) Date of Patent: Feb. 18, 2014

(54) DISTORTION COMPENSATION DEVICE, TRANSMITTER, AND DISTORTION COMPENSATION METHOD

(75) Inventors: Nobukazu Fudaba, Kawasaki (JP); Hiroyoshi Ishikawa, Kawasaki (JP); Yuichi Utsunomiya, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 68 days.

(21) Appl. No.: 13/367,532

(22) Filed: Feb. 7, 2012

(65) Prior Publication Data

US 2012/0202440 A1    Aug. 9, 2012

(30) Foreign Application Priority Data

Feb. 9, 2011    (JP) .................................. 2011-026406

(51) Int. Cl.
*H04B 1/04*    (2006.01)

(52) U.S. Cl.
USPC .......... 455/114.3; 455/91; 455/126; 455/108; 455/127.2; 375/296; 375/297; 375/298; 330/136; 330/149

(58) Field of Classification Search
USPC ............. 455/91, 102, 114.3, 126, 108, 127.1, 455/127.2; 330/136, 149; 375/296–298
See application file for complete search history.

(56) References Cited

U.S. PATENT DOCUMENTS

| 8,050,637 B2 * | 11/2011 | Shimizu et al. ............. 455/114.3 |
| 2001/0007435 A1 * | 7/2001 | Ode et al. ...................... 330/149 |

FOREIGN PATENT DOCUMENTS

JP    2001-251148    9/2001

* cited by examiner

*Primary Examiner* — Tuan Pham
(74) *Attorney, Agent, or Firm* — Katten Muchin Rosenman LLP

(57) ABSTRACT

A distortion compensation device includes a distortion compensator that predistorts an input signal based on delay signals and distortion compensation coefficients corresponding to the respective delay signals obtained by applying different amounts of delay to the input signal, a calculator that calculates an error signal based on the predistorted input signal and an output signal from an amplifier that amplifies the predistorted input signal, a calculator that calculates prospective distortion compensation coefficients for updating the distortion compensation coefficients, based on the error signal, a saturation processor that performs saturation processing for bringing, when the prospective distortion compensation coefficients do not fall into a preset range, the prospective distortion compensation coefficients into the preset range, and a controller that controls the updating of the distortion compensation coefficients based on pieces of coefficient saturation information indicating whether the saturation processing is performed on the prospective distortion compensation coefficients.

12 Claims, 11 Drawing Sheets

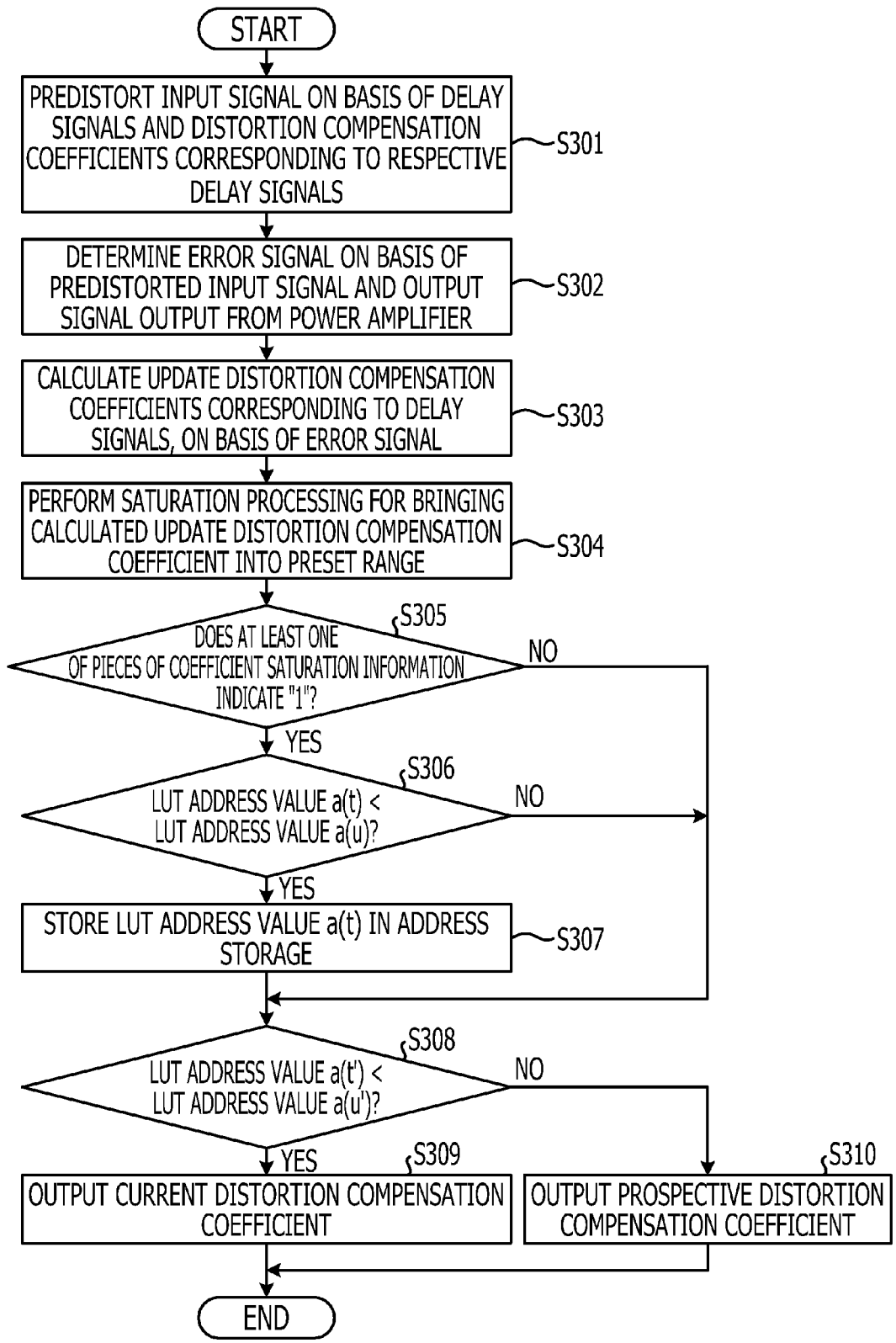

US 8,655,289 B2

DISTORTION COMPENSATION DEVICE, TRANSMITTER, AND DISTORTION COMPENSATION METHOD

CROSS-REFERENCE TO RELATED APPLICATION

This application is based upon and claims the benefit of priority of the prior Japanese Patent Application No. 2011-026406, filed on Feb. 9, 2011, the entire contents of which are incorporated herein by reference.

FIELD

Embodiments discussed herein are related to a distortion compensation device, a transmitter, and a distortion compensation method.

BACKGROUND

Recently, the bandwidth and dynamic range of transmission signals have been increasingly widened in conjunction with increased speeds of radio communication. Under such a circumstance, it is desirable that power amplifier devices have higher linearity in order to minimize deterioration of the signal quality. Concurrently, in terms of miniaturization of devices, reduction of operating costs, environmental issues, and so on, there are increasing demands for power amplifier devices that operate with high power-conversion efficiency.

SUMMARY

According to an aspect of the embodiments discussed herein, a distortion compensation device includes a distortion compensator that predistorts an input signal based on delay signals and distortion compensation coefficients corresponding to the respective delay signals obtained by applying different amounts of delay to the input signal, a calculator that calculates an error signal based on the predistorted input signal and an output signal from an amplifier that amplifies the predistorted input signal, a calculator that calculates prospective distortion compensation coefficients for updating the distortion compensation coefficients, based on the error signal, a saturation processor that performs saturation processing for bringing, when the prospective distortion compensation coefficients do not fall into a preset range, the prospective distortion compensation coefficients into the preset range, and a controller that controls the updating of the distortion compensation coefficients based on pieces of coefficient saturation information indicating whether the saturation processing is performed on the prospective distortion compensation coefficients.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a flowchart of the processing of a distortion compensation device according to the third embodiment.

DESCRIPTION OF EMBODIMENTS

Figure 1:
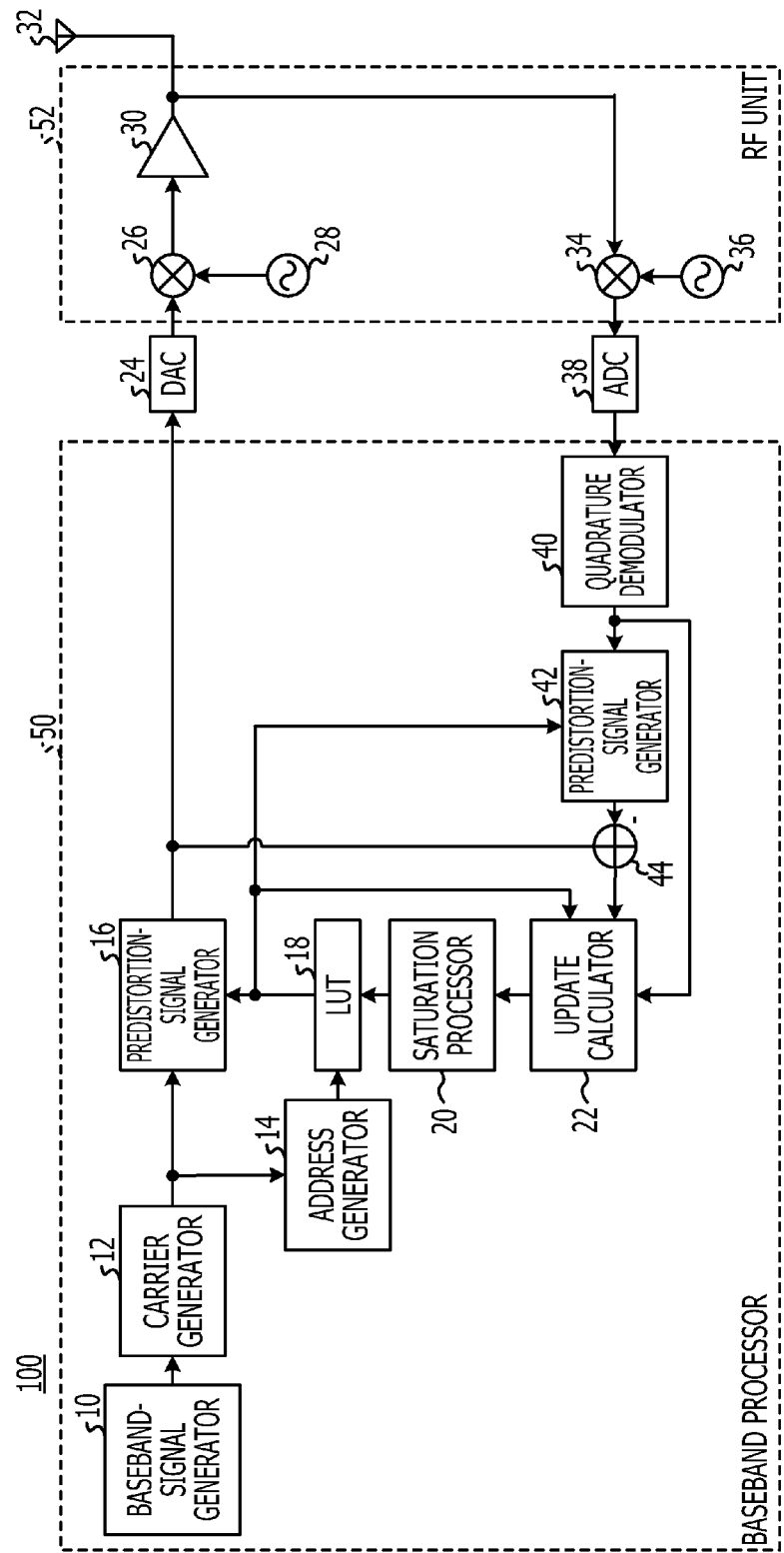
FIG. 1 is a diagram illustrating an overall configuration of a transmitter according to a first embodiment.

A distortion compensation device, a transmitter, and a distortion compensation method according to embodiments disclosed herein will be described below with reference to the accompanying drawings.

While inventing the present embodiments, observations were made regarding a related art. Such observations include the following, for example.

In typical power amplifier devices, there is a trade-off relationship between the linearity and the power-conversion efficiency. For example, when the power amplifier device is backed off from its saturation power and operated in a linear region, the amount of out-of-band distortion may be reduced. In this case, however, the power-conversion efficiency decreases significantly and the power consumption of the power amplifier device increases. Accordingly, in order to achieve both of the linearity and the power-conversion efficiency, the power amplifier device is operated in a nonlinear region where the power-conversion efficiency is high and a distortion compensation device is used to remove nonlinear distortion produced during the operation, to thereby maintain the linearity. A predistortion system, which is one of distortion compensation systems, may be employed for the distortion compensation device. In the predistortion system, a transmission signal is pre-multiplied by an inverse characteristic of nonlinear distortion of the power amplifier device to thereby enhance the linearity of output of the power amplifier device. As a specific example, a look-up-table (LUT) based distortion compensation device is available. The LUT-based distortion compensation device enhances the linearity of outputs of a power amplifier device by multiplying the transmission signal by a distortion compensation coefficient stored in a LUT in accordance with the amplitude of a transmission signal.

It is known that a "memory effect" occurs in distortion compensation devices that operate with high power efficiency. The memory effect is a phenomenon that an output with respect to an input to a power amplifier at one point in timer is affected by the previous input data. Accordingly, when distortion compensation provided by a non-memory predistortion system that has no countermeasures for the memory effect, i.e., distortion compensation in which the distortion compensation coefficients stored in the LUT are determined according to only the signal amplitude at the current time, is applied to a power amplifier device that operates with high power efficiency, there are cases in which it is difficult to provide a desired distortion suppression effect. Accordingly, in order to provide a desired distortion suppression effect for a power amplifier device that operates with high power efficiency, there has been proposed distortion compensation provided by a memory-predistortion system that has countermeasures for the memory effect and that generates a predistortion signal by using previous data as well as data at the current time. One example of a distortion compensation device employing such distortion compensation provided by a memory-predistortion system having countermeasures for the memory effect is a device that has a transversal-filter structure for a transmission signal and a distortion compensation coefficient to generate a predistortion signal. A predistortion signal generated using the transversal-filter structure will hereinafter be referred to as a "transversal predistortion signal".

Here, a description will be given of an exemplary operation of a distortion compensation device of related art using the transversal predistortion signal. In this example, the distortion compensation device is assumed to have a forward predistortion-signal generator and a feedback predistortion-signal generator. In the distortion compensation device, distortion compensation coefficients for respective transmission signals delayed by different amounts of delay time are stored in multiple LUTs. The distortion compensation coefficients stored in the LUTs are input to the forward predistortion-signal generator having a transversal filter structure. The forward predistortion-signal generator multiplies transmission signals by the distortion compensation coefficients, the transmission signals and the distortion compensation coefficients having the corresponding same amounts of delay time, adds the resulting multiplication results to generate a signal, and outputs the signal as a predistortion signal having an inverse characteristic of the nonlinear distortion of a power amplifier.

The forward predistortion signal is subjected to DA (digital-to-analog) conversion, the resulting signal is up-converted into a signal having a carrier frequency, and the signal is input to the power amplifier. A signal whose nonlinear distortion is removed through the predistortion is output from the power amplifier, is partially looped back by a directional coupler, and is subjected to down-conversion, AD (analog-to-digital) conversion, and demodulation processing, so that a digital feedback signal is obtained. The feedback predistortion-signal generator has a structure that is similar to that of the forward predistortion-signal generator. The feedback predistortion signal is used to predistort the feedback signal. The distortion compensation device calculates values for updating the distortion compensation coefficients so that power of an error signal, which is a difference between the forward predistortion signal and the feedback predistortion signal, is minimized and then updates the distortion compensation coefficients stored in the LUTs. The values for updating the distortion compensation coefficients are subjected to saturation processing, such as clipping, so that they fall into a preset range.

In the related art, however, no consideration has been given to deterioration of the performance of distortion compensation due to the saturation processing of the distortion compensation coefficients.

That is, in the related art, the saturation processing for the updated distortion compensation coefficients is performed independently at each LUT, the uniformity of the saturation processing for the LUTs is lost, which may cause deterioration of the distortion compensation performance of the overall distortion compensation device.

For example, when a distortion compensation coefficient in one $LUT_i$ ($0 \le i \le N$, where N is a positive integer) is saturated and clipped, an operation may be performed so that another $LUT_j$ (($0 \le j \le N$, $i \ne j$) compensates for a shortage of the coefficient clipped in the $LUT_i$. In this case, however, there are cases in which the distortion compensation coefficient of the $LUT_j$ may be updated to a value that is different from an original optimum value. This may cause deterioration of the distortion compensation performance of the overall distortion compensation device.

First Embodiment

FIG. 1 is a diagram illustrating an overall configuration of a transmitter according to a first embodiment. As illustrated in FIG. 1, a transmitter 100 according to the present embodiment includes a baseband-signal generator 10, a carrier generator 12, an address generator 14, a predistortion-signal generator 16, a LUT (look-up table) 18, a saturation processor 20, and an update calculator 22. The transmitter 100 further includes a DAC (digital-to-analog converter) 24, an up-converter 26, an oscillator 28, a power amplifier 30, and an antenna 32. The transmitter 100 further includes a down-converter 34, an oscillator 36, an ADC (analog-to-digital converter) 38, a quadrature demodulator 40, a predistortion-signal generator 42, and a subtractor 44. A distortion compensation device includes, at least, the address generator 14, the predistortion-signal generator 16, the LUT 18, the saturation processor 20, the update calculator 22, and the subtractor 44. The baseband-signal generator 10, the carrier generator 12, the address generator 14, the predistortion-signal generator 16, the LUT 18, the saturation processor 20, the update calculator 22, the quadrature demodulator 40, the predistortion-signal generator 42, and the subtractor 44 constitute a baseband processor 50. The baseband processor 50 is implemented by, for example, a CPU (central processing unit) or a DSP (digital signal processor). The up-converter 26, the oscillator 28, the power amplifier 30, the down-converter 34, and the oscillator 36 constitute an RF (radio frequency) unit 52. The RF unit 52 is implemented by an analog circuit or the like.

The baseband-signal generator 10 generates a baseband signal. The baseband-signal generator 10 then outputs the generated baseband signal to the carrier generator 12.

The carrier generator 12 receives the baseband signal from the baseband-signal generator 10. The carrier generator 12 then modulates the received baseband signal to generate a carrier (or a multi-carrier) signal, which serves as a transmission signal. The carrier generator 12 then outputs the generated transmission signal to the address generator 14 and the predistortion-signal generator 16.

In accordance with amplitude of the transmission signal, the address generator 14 generates, for the LUT 18, addresses at which multiple distortion compensation coefficients are stored. On the basis of delay signals obtained by applying different amounts of delay to the transmission signal and distortion compensation coefficients corresponding to the respective delay signals, the predistortion-signal generator 16 predistorts the transmission signal and outputs the predistorted transmission signal to the DAC 24. The LUT 18 in which the distortion compensation coefficients are stored may be implemented by a memory. The update calculator 22 calculates the adjustment of distortion compensation coefficients (referred to as "prospective distortion compensation coefficients" herein) for adaptively updating the distortion compensation coefficients so that power of an error signal calculated by the subtractor 44 is minimized. The saturation processor 20 performs saturation processing for bringing the prospecitve distortion compensation coefficients, calculated by the update calculator 22, into a preset range (a desired amplitude range). The saturation processor 20 outputs, to the LUT 18, the prospective saturation compensation coefficients on which the saturation processing has been performed, to thereby update the LUT 18. Details of the address generator 14, the predistortion-signal generator 16, the LUT 18, the saturation processor 20, and the update calculator 22 are described below.

The DAC 24 receives the predistortion transmission signal input from the predistortion-signal generator 16. The DAC 24 converts the received predistortion signal from a digital signal to an analog signal. The DAC 24 outputs the resulting analog predistortion signal to the up-converter 26.

The up-converter 26 receives the predistortion signal from the DAC 24. Using a signal input from the oscillator 28, the up-converter 26 up-converts the frequency of the received predistortion signal into a carrier frequency. The up-converter 26 outputs the predistortion signal with the carrier frequency to the power amplifier 30. That is, the predistortion signal is converted by the DAC 24 into an analog signal, which is frequency-converted by the up-converter 26 and the oscillator 28 into an RF signal, which is then input to the power amplifier 30.

The power amplifier 30 receives the predistortion signal from the up-converter 26. The power amplifier 30 amplifies the received predistortion signal to generate a transmission signal whose nonlinear distortion is removed. The power amplifier 30 outputs the transmission signal, which is then split into two transmission signals. One of the transmission signals is transmitted to an external receiver device via the antenna 32 and the other transmission signal is sent to the down-converter 34.

The down-converter 34 receives the transmission signal output from the power amplifier 30. Using a signal received from the oscillator 36, the down-converter 34 down-converts the received transmission signal into a baseband signal or an IF (intermediate frequency) signal. The down-converter 34 outputs the down-converted signal, i.e., the baseband signal or the IF signal, to the ADC 38.

The ADC 38 receives the down-converted signal from the down-converter 34. The ADC 38 converts the received down-converted signal into a digital signal. The ADC 38 then outputs the digital signal to the quadrature demodulator 40.

The quadrature demodulator 40 receives the digital signal from the ADC 38. The quadrature demodulator 40 performs quadrature demodulation on the received digital signal to generate a feedback signal including an I (in-phase) signal and a Q (quadrature) signal. The quadrature demodulator 40 outputs the feedback signal to the predistortion-signal generator 42 and the update calculator 22.

The predistortion-signal generator 42 has a configuration (not illustrated) that is similar to a configuration (described below) of the predistortion-signal generator 16. In the present embodiment, the predistortion-signal generator 42 has N taps, N+1 multipliers, and one adder. The predistortion-signal generator 42 receives the feedback signal from the quadrature demodulator 40. The predistortion-signal generator 42 has a tap delay line through which the received feedback signal is caused to pass, thereby sequentially delaying the feedback signal. In the predistortion-signal generator 42, the signals immediately after being delayed through the taps are split, so that N signals are generated. More specifically, the N signals are signals obtained by applying delays of $\tau, 2\tau, \ldots,$ and $N\tau$ to the feedback signal. In the predistortion-signal generator 42, the feedback signal and the delayed feedback signals are then input to the corresponding multipliers therein. The distortion compensation coefficients output from the LUT 18 are also input to the multipliers in the predistortion-signal generator 42. In the predistortion-signal generator 42, the multipliers perform multiplications and the multiplication results are input to the adder. In the predistortion-signal generator 42, the adder adds the multiplication results to generate a predistorted feedback signal (hereinafter referred to as a "feedback predistortion signal"). The predistortion-signal generator 42 outputs the feedback predistortion signal to the subtractor 44.

The subtractor 44 receives the predistortion signal from the predistortion-signal generator 16. The subtractor 44 also receives the feedback predistortion signal from the predistortion-signal generator 42. The subtractor 44 calculates a difference between the predistortion signal and the feedback predistortion signal to generate an error signal. The subtractor 44 outputs the generated error signal to the update calculator 22.

Figure 2:
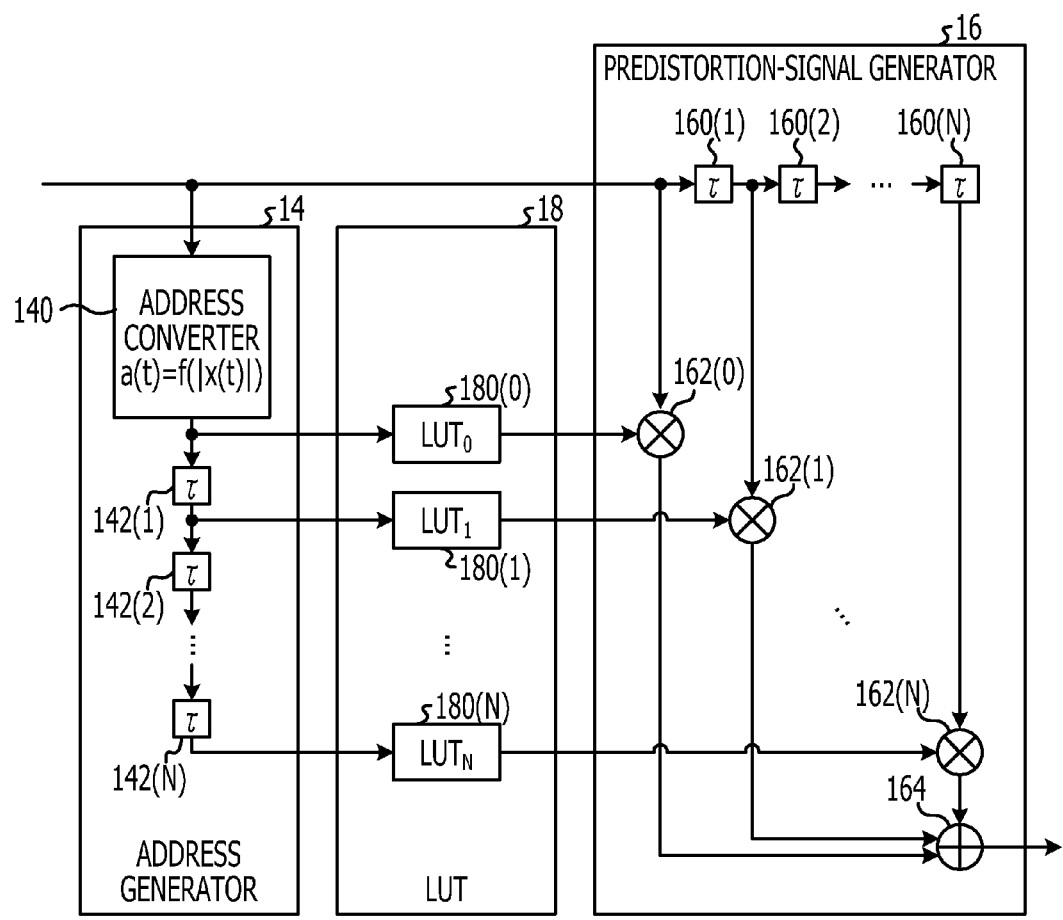
FIG. 2 is a diagram illustrating the configurations of an address generator, a predistortion-signal generator, and a LUT in the transmitter according to the first embodiment.

Now, details of the address generator 14, the predistortion-signal generator 16, and the LUT 18 are described with reference to FIG. 2. FIG. 2 is a diagram illustrating the configurations of the address generator, the predistortion-signal generator, and the LUT in the transmitter according to the first embodiment. As illustrated in FIG. 2, the address generator 14 has an address converter 140 and N taps 142(1) to 142(N), where N is a positive integer. The N taps 142(1) to 142(N), each of which applies a delay time $\tau$, are arranged in series to form a tap delay line. The address converter 140 receives the transmission signal input from the carrier generator 12. The transmission signal input from the carrier generator 12 will hereinafter be referred to as an "input signal". The LUT 18 includes N+1 LUTs, i.e., $LUT_0$ 180(0) to $LUT_N$ 180(N). The taps 142(1) to 142(N) may simply be referred to as "taps 142" hereinafter, when they are not distinguished from each other. The $LUT_0$ 180(0) to $LUT_N$ 180(N) may simply be referred to as "LUTs 180" hereinafter, when they are not distinguished from each other.

The address converter 140 has a function for converting the amplitude of the input signal into an address in the LUTs 180. For example, letting a(t) be the address value of the $LUT_0$ 180(0) at a time t, the address converter 140 determines the address value a(t) by using a function expressed as $a(t)=f(|x(t)|)$, where x(t) represents the input signal at the time t and the |x(t)| represents the amplitude of the input signal at the time t. That is, the address converter 140 outputs the address value of the LUTs 180 which corresponds to the amplitude of the input signal.

In the address generator 14, the address value a(t) output from the address converter 140 is sequentially caused to pass through the taps 142(1) to 142(N) along the tap delay line. Each of the taps 142 applies, for each clock, the delay time $\tau$ to the address value a(t) that passes therethrough. In the address generator 14, the address value a(t) that has not passed through the taps 142 is supplied to the $LUT_0$ 180(0). In the address generator 14, the address values a(t−1), a(t−2), . . . , and a(t−N) obtained immediately after passing through the taps 142(1), 142(2), . . . , 142(N) are supplied to the corresponding $LUT_1$ 180(1), $LUT_2$ 180(2), . . . , and $LUT_N$ 180(N), respectively.

As illustrated in FIG. 2, the predistortion-signal generator 16 has N taps 160(1) to 160(n), N+1 multipliers 162(0) to 162(N), and an adder 164. The taps 160(1) to 160(N) may simply be referred to as "taps 160" hereinafter, when they are not distinguished from each other. The multipliers 162(0) to 162(N) may simply be referred to as "multipliers 162" hereinafter, when they are not distinguished from each other.

As illustrated in FIG. 2, in the predistortion-signal generator 16, the N taps 160, each of which applies a delay time τ, are arranged in series to form a tap delay line. The predistortion-signal generator 16 receives the transmission signal input from the carrier generator 12.

In the predistortion-signal generator 16, the input signal is caused to sequentially pass through the taps 160(1) to 160(N) along the tap delay line. Each of the taps 160(1) to 160(N) applies a delay time τ to the input signal that passes therethrough. In the predistortion-signal generator 16, the input signals obtained immediately after passing through the taps 160(1) to 160(N) are supplied to the multipliers 162(1) to 162(N), respectively. That is, the predistortion-signal generator 16 generates N signals obtained by applying delay times τ, 2τ, . . . , Nτ to the input signal. In the following description, N+1 signals generated by adding the original input signal to the N signals to which delays are applied by the taps 160(1) to 160(N) are hereinafter referred to as "delay signals", assuming that the original input signal is a signal to which a zero delay is applied.

The multiplier 162(0) corresponds to the input signal to which no delay is applied and the N multipliers 161(1) to 162(N) correspond to the taps 160(1) to 160(N). The multiplier 162(0) receives the input signal and the other multipliers 162(1) to 162(N) receive the corresponding signals output from the corresponding taps 160(1) to 160(N). That is, the N+1 multipliers 162(0) to 162(N) receives the corresponding delay signals. In addition, the multipliers 162(0) to 162(N) receive the distortion compensation coefficients from the LUTs 180(0) to 180(N), respectively. In other words, the multiplier 162(i) receives the distortion compensation coefficient from the LUT$_i$, where i=0, 1, . . . , and N. The multiplier 162 performs complex multiplication on the received delay signal and the distortion compensation coefficient and outputs the multiplication result to the adder 164. When the received distortion compensation coefficient is "0", the multiplier 162 outputs "0".

The adder 164 receives the multiplication results from the multipliers 162. The adder 164 adds the received N+1 multiplication results to generate a predistorted transmission signal (hereinafter referred to as a "predistortion signal"). The predistortion signal has an inverse characteristic of the nonlinear distortion of the power amplifier 30. In this case, when the multiplication result received from one of the multipliers 162 indicates "0", the delay signal input to this multiplier is not used for generating the predistortion signal.

The adder 164 outputs the generated predistortion signal to the DAC 24. The adder 164 also outputs the generated predistortion signal to the subtractor 44.

The update calculator 22 receives the error signal from the subtractor 44, as illustrated in FIG. 1. The update calculator 22 also receives the distortion compensation coefficients from the LUT 18. The update calculator 22 further receives the feedback signal from the quadrature demodulator 40. The update calculator 22 applies an LMS (least mean square) algorithm, which is a steepest descent method, to the received error signal and the feedback signal to calculate a new distortion compensation coefficient (i.e., a prospective distortion compensation coefficient). The update calculator 22 supplies the new distortion compensation coefficient to the saturation processor 20.

Figure 3:
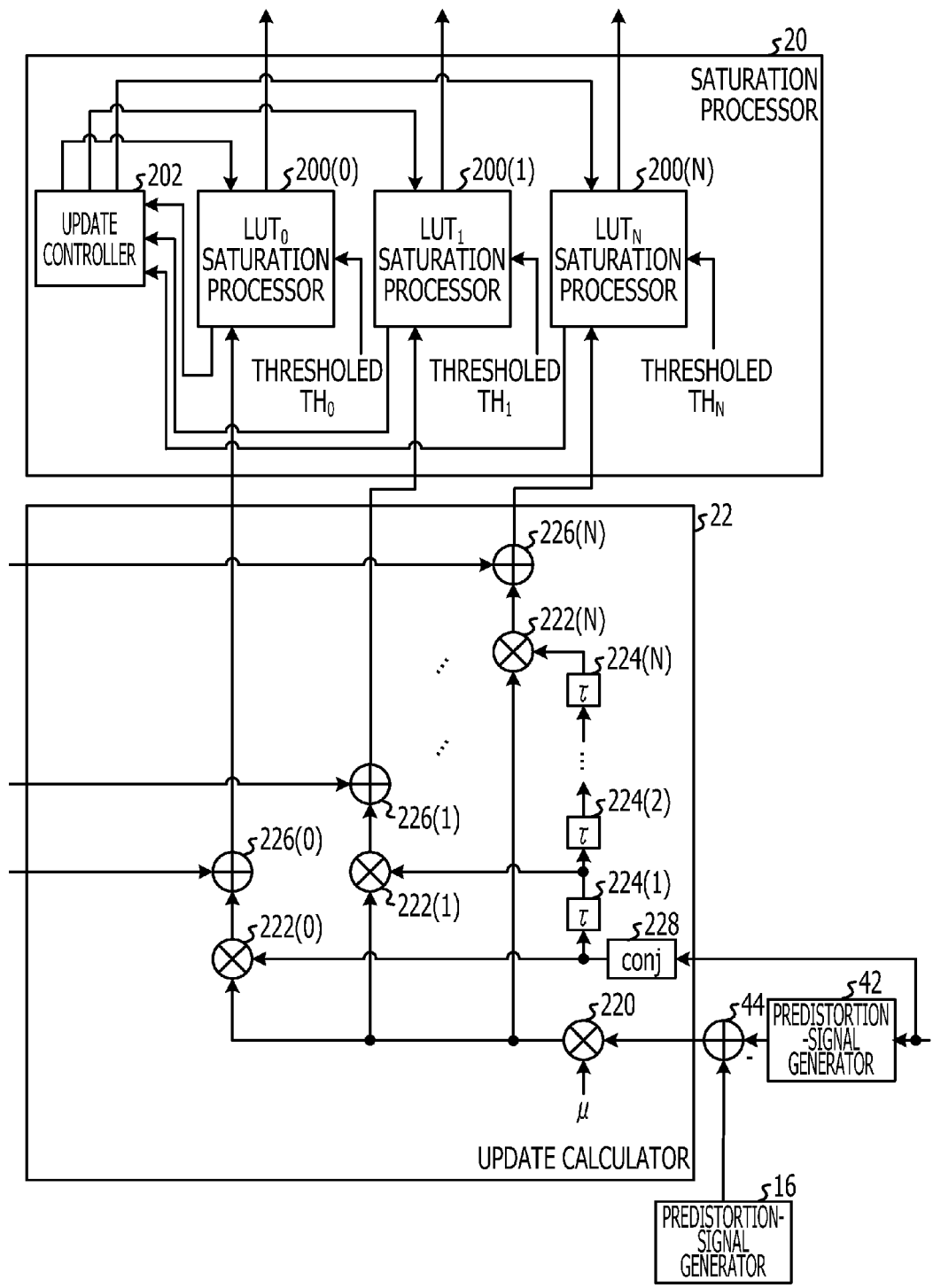
FIG. 3 is a diagram illustrating the configurations of a saturation processor and an update calculator in the transmitter according to the first embodiment.

Details of the saturation processor 20 and the update calculator 22 will now be described with reference to FIG. 3. FIG. 3 is a diagram illustrating the configurations of the saturation processor and the update calculator in the transmitter according to the first embodiment. As illustrated in FIG. 3, the update calculator 22 has one multiplier 220, N+1 multipliers 222(0) to 222(N), and N taps 224(1) to 224(N). The update calculator 22 further has N+1 adders 226(0) to 226(N) and a complex-conjugate operator 228 (illustrated as "conj"). The multipliers 222(0) to 222(N) may simply be referred to as "multipliers 222" hereinafter, when they are not distinguished from each other, and the taps 224(1) to 224(N) may simply be referred to as "taps 224" hereinafter, when they are not distinguished from each other.

As illustrated in FIG. 3, the saturation processor 20 has one update controller 202 and N+1 LUT saturation processors, i.e., a LUT$_0$ saturation processor 200(0) to a LUT$_N$ saturation processor 200(N). Thresholds TH$_0$ to TH$_N$ are input to the LUT$_0$ saturation processor 200(0) to the LUT$_N$ saturation processor 200(N), respectively. The LUT$_0$ saturation processor 200(0) to the LUT$_N$ saturation processor 200(N) may simply be referred to as "LUT saturation processors 200" hereinafter, when they are not distinguished from each other.

The multiplier 220 receives the error signal (hereinafter denoted by "e(t)") from the subtractor 44. The predistortion signal supplied from the predistortion-signal generator 16 is given as u(t) in equation (1) below.

$$u(t) = \sum_{i=0}^{N} x(t-i) \times LUT_i\{a(t-i)\} \quad (1)$$

The signal supplied from the predistortion-signal generator 42 is given as v(t) in equation (2) below.

$$v(t) = \sum_{i=0}^{N} y(t-i) \times LUT_i\{a(t-i)\} \quad (2)$$

The error signal e(t) supplied to the multiplier 220 is expressed by u(t)−v(t).

The multiplier 220 multiplies the error signal e(t) by a step size μ, i.e., scales the error signal e(t) with the step size μ, to determine an error signal (μ×e(t)). The multiplier 220 then outputs the error signal (μ×e(t)) to the multipliers 222(0) to 222(N).

The complex-conjugate operator 228 receives the feedback signal y(t) from quadrature demodulator 40. The complex-conjugate operator 228 then determines a complex conjugate y(t)* of the feedback signal y(t) and outputs the complex conjugate y(t)* to the multiplier 222(0) and the tap 224(1), where "*" represents a complex conjugate operation.

The tap 224(1) applies a delay τ to the complex conjugate y(t)* and outputs the resulting signal to the multiplier 222(1) and the tap 224(2). That is, the tap 224(j) (1≤j≤N) applies a delay τ to the input signal and outputs the resulting signal to the multiplier 222(j) and the tap 224(j+1). However, since the tap 224(N) has no subsequent tap, the tap 224(N) merely applies a delay τ to the input signal and outputs the resulting signal to the multiplier 222(N). The signals before and after the delay τ is applied by the 224(i) will hereinafter be collectively expressed by y(t−i)*(0≤i≤N). In this case, y(t−i)* is a complex conjugate of the feedback signal y(t−i) at i clocks earlier. For i=0, y(t−i)* is equal to the complex conjugate of the original feedback signal y(t).

The multiplier 222(i) multiplies the error signal "μ×e(t)" by the complex conjugate y(t−i)* of the feedback signal to which the delay iτ is applied, to thereby determine μ×e(t)×y (t−i)*. The multiplier 222(i) then outputs the multiplication result "μ×e(t)×y(t−i)*" to the adder 226(i).

The adder 226(i) receives a distortion compensation coefficient $LUT_i\{a(t−i)\}$ output from the $LUT_i$ 180(i). The adder 226(i) also receives the multiplication result "μ×e(t)×y(t−i)*" from the multiplier 222(i). The adder 226(i) then adds the distortion compensation coefficient $LUT_i\{a(t)\}$ and the multiplication result "μ×e(t)×y(t−i)*" to determine $LUT_i\{a(t)\}$+μ×e(t)×y(t−i)* as a new distortion compensation coefficient at address a(t) of the $LUT_i$ 180(i). The adder 226(i) supplies the prospective distortion compensation coefficient "$LUT_i\{a(t)\}$+μ×e(t)×y(t−i)*" to the $LUT_i$ saturation processor 200(i).

The LUT saturation processor 200 performs saturation processing for bringing the corresponding prospective distortion compensation coefficient "$LUT_i\{a(t)\}$+μ×e(t)×y(t−i)*", calculated by the update calculator 22, into a preset range. More specifically, when the amplitude of the prospective distortion compensation coefficient corresponding to the LUT 180 exceeds a thresholds TH prepared for the corresponding LUT 180 (i.e., the coefficient is saturated), as given by expression (3) below, the LUT saturation processor 200 restricts the corresponding distortion compensation coefficient by performing processing, such as clipping.

$$|LUT_i\{a(t−i)\}| = \begin{cases} TH_i & (\text{For } |LUT_i\{a(t−i)\}| > TH_i) \\ |LUT_i\{a(t−i)\}| & (\text{For } |LUT_i\{a(t−i)\}| \leq TH_i) \end{cases} \quad (3)$$

The update controller 202 receives, from each LUT saturation processor 200, a piece of coefficient saturation information indicating whether or not the saturation processing is performed on the corresponding prospective distortion compensation coefficients "$LUT_i\{a(t)\}$+μ×e(t)×y(t−i)*". On the basis of the coefficient saturation information received from the LUT saturation processors 200, the update controller 202 outputs, to the LUT saturation processor 200, a control signal for controlling the distortion compensation coefficient output from the LUT saturation processor 200. By doing so, the update controller 202 controls the distortion compensation coefficient output from each LUT saturation processors 200. In other words, the update controller 202 controls the updating of the distortion compensation coefficients in the LUTs 180, on the basis of the respective pieces of coefficient saturation information received from the corresponding LUT saturation processors 200. For example, on the basis of the pieces of coefficient saturation information of the prospective distortion compensation coefficients, the update controller 202 updates the distortion compensation coefficients, stored in the LUTs 180, with the prospective distortion compensation coefficients or disables the updating of the distortion compensation coefficients with the prospective distortion compensation coefficients. The "disabling the updating of the distortion compensation coefficients with the prospective distortion compensation coefficients" means that the distortion compensation coefficients stored in the LUTs 180 are not to be updated with the prospective distortion compensation coefficients. Alternatively, the "disabling the updating of the distortion compensation coefficients with the prospective distortion compensation coefficients" means that the distortion compensation coefficients stored in the LUTs 180 are updated again with the current distortion compensation coefficients already stored in the LUTs 180, not with the prospective distortion compensation coefficients.

Figure 4:
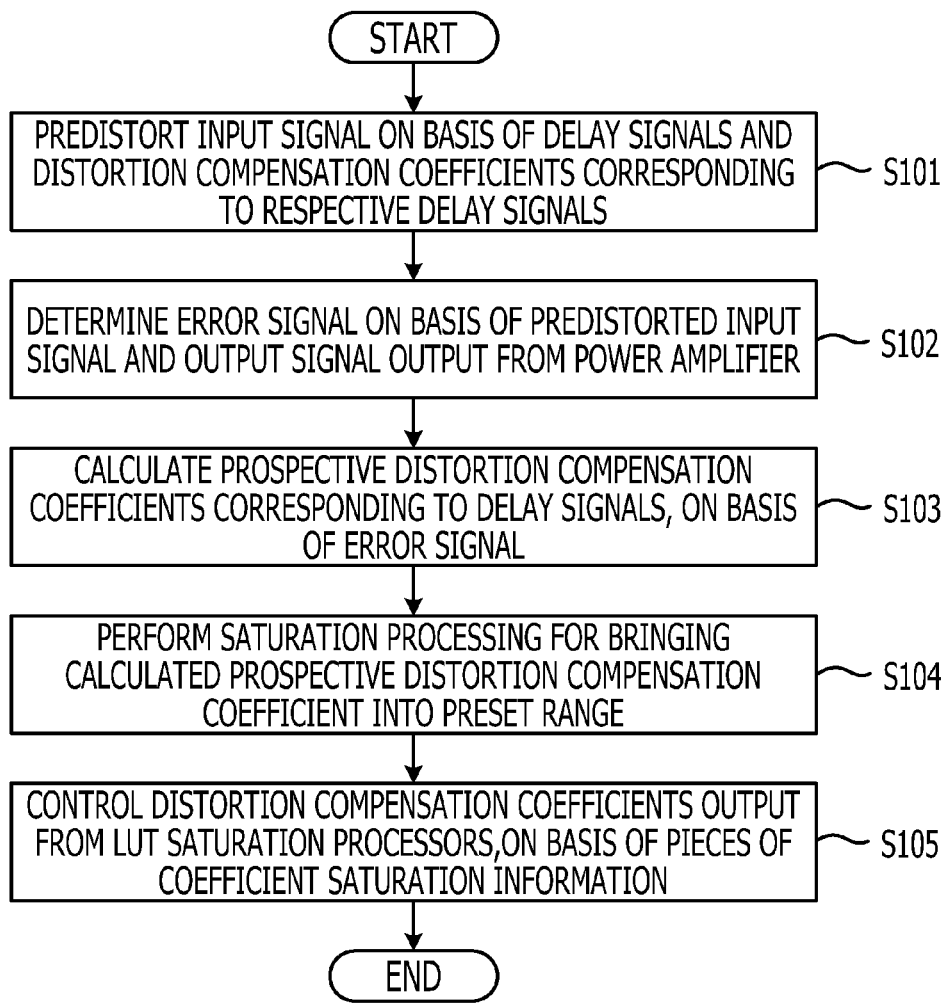
FIG. 4 is a flowchart of the processing of a distortion compensation device according to the first embodiment.

Processing of the distortion compensation device according to the first embodiment will now be described with reference to FIG. 4. FIG. 4 is a flowchart of the processing of the distortion compensation device according to the first embodiment. As illustrated in FIG. 4, first, in step S101, the predistortion-signal generator 16 predistorts an input signal on the basis of delay signals and distortion compensation coefficients corresponding to the respective delay signals, the delay signals being obtained by applying different amounts of delay to the input signal. In step S102, the subtractor 44 calculates an error signal on the basis of the input signal predistorted in step S101 and an output signal from the power amplifier 30 that amplifies the predistorted input signal.

In step S103, on the basis of the error signal calculated in step S102, the update calculator 22 calculates prospective distortion compensation coefficients corresponding to the delay signals obtained by applying the different amounts of delay to the input signal. In step S104, the LUT saturation processors 200 perform saturation processing for bringing the prospective distortion compensation coefficients, calculated in step S103, into a preset range. In step S105, on the basis of pieces of coefficient saturation information indicating whether or not the saturation processing is performed on the prospective distortion compensation coefficients calculated in step S103, the update controller 202 controls the distortion compensation coefficients output from the LUT saturation processors 200.

According to the first embodiment described above, it is possible to suppress degradation of the performance of the distortion compensation caused by the saturation processing on the distortion compensation coefficients. That is, rather than performing independent saturation processing on the distortion compensation coefficients in the LUTs 180, the distortion compensation device according to the first embodiment monitors saturation of the distortion compensation coefficients in the LUTs 180 and controls the saturation processing of the distortion compensation coefficients in the LUTs 180 on the basis of information resulting from the saturation monitoring. Thus, according to the distortion compensation device of the first embodiment, since the LUT saturation processors 200 are controlled based on the pieces of coefficient saturation information collected from the LUTs 180, saturation of the distortion compensation coefficient in one LUT does not disorderly affect the other LUTs. As a result, the distortion compensation device according to the first embodiment may suppress deterioration of the performance of distortion compensation during saturation of the distortion compensation coefficients.

Second Embodiment

Figure 5:
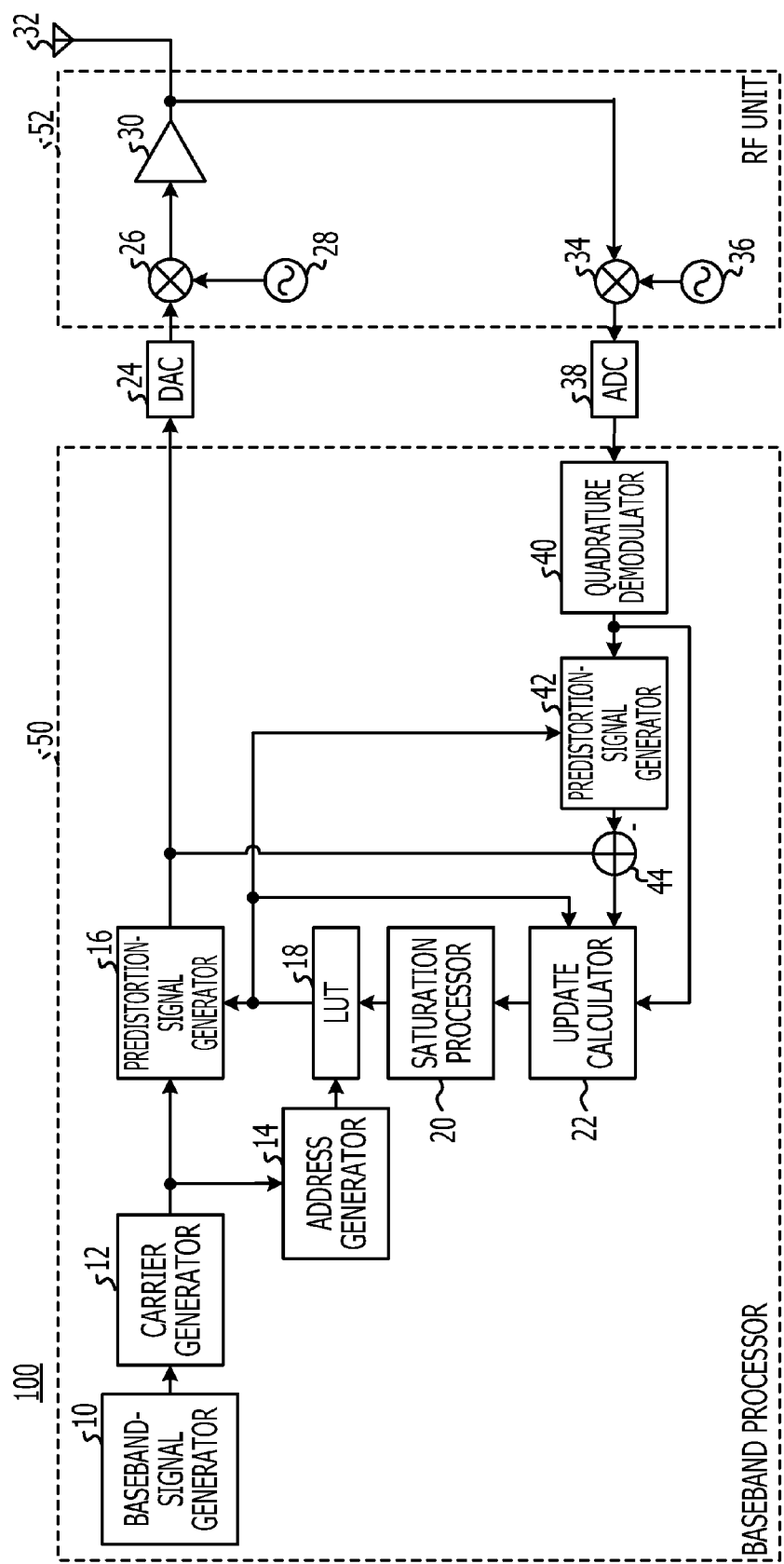
FIG. 5 is a diagram illustrating an overall configuration of a transmitter according to a second embodiment.
Figure 6:
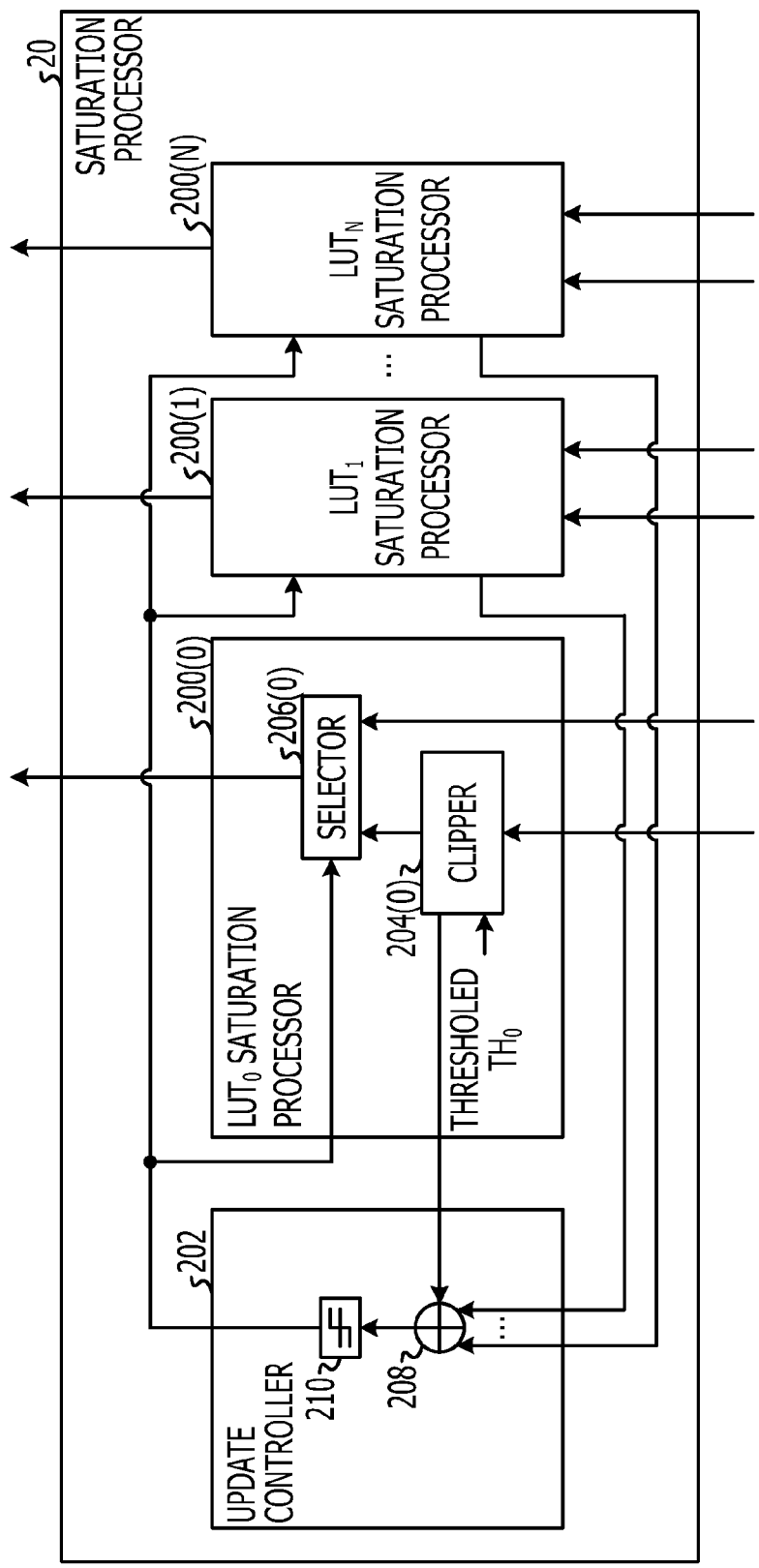
FIG. 6 is a diagram illustrating the configuration of a saturation processor in the transmitter according to the second embodiment.
Figure 7:
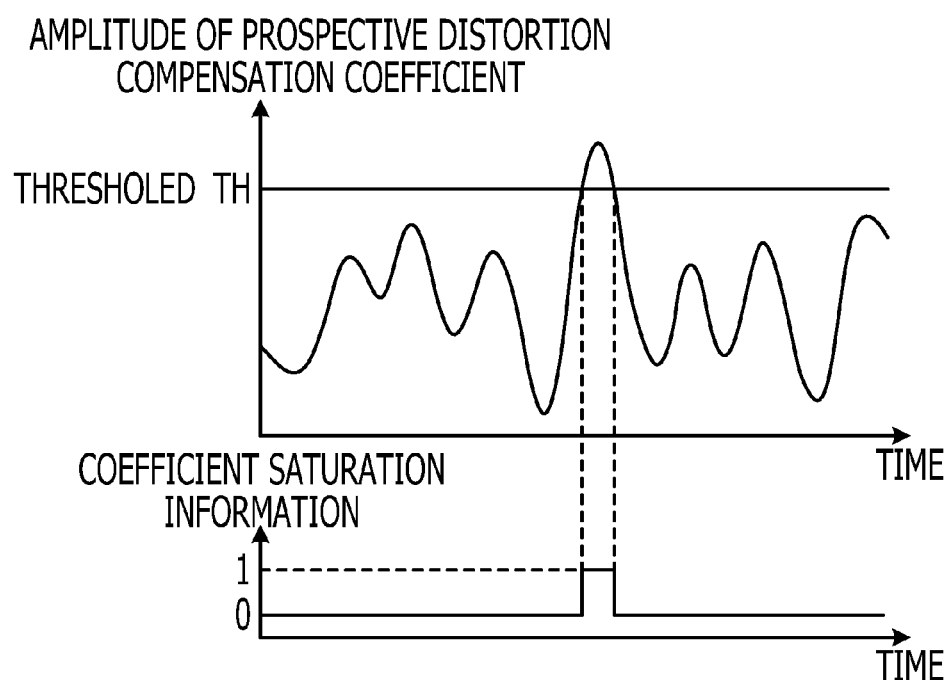
FIG. 7 illustrates one example of coefficient saturation information in the transmitter according to the second embodiment.

A transmitter according to a second embodiment will be described next. FIG. 5 is a diagram illustrating an overall configuration of a transmitter according to a second embodiment. FIG. 6 is a diagram illustrating the configuration of a saturation processor in the transmitter according to the second embodiment. FIG. 7 illustrates one example of coefficient saturation information in the transmitter according to the second embodiment. In the upper graph in FIG. 7, the horizontal axis indicates time and the vertical axis indicates the amplitude of the prospective distortion compensation coefficient. In the lower graph in FIG. 7, the horizontal axis indicates time and the vertical axis indicates the coefficient saturation information. The configuration of the transmitter according to the second embodiment is similar to the configuration of the transmitter according to the first embodiment, except for the configuration of the saturation processor 20, as illustrated in FIGS. 5 and 6. Thus, descriptions of the similar configurations are not given hereinafter.

As illustrated in FIG. 6, a $LUT_0$ saturation processor 200 (0) in the second embodiment has a clipper 204(0) and a selector 206(0). A threshold $TH_0$ and the prospective distortion compensation coefficient calculated by the update calculator 22 are input to the clipper 204(0).

When the amplitude of the prospective distortion compensation coefficient is larger than the threshold $TH_0$, the clipper 204 (0) makes the amplitude of the prospective distortion compensation coefficient to match the threshold $TH_0$ (i.e., clips the amplitude with the threshold) and outputs the resulting prospective distortion compensation coefficient to the selector 206(0). When the amplitude of the prospective distortion compensation coefficient is smaller than or equal to the threshold $TH_0$, the clipper 204(0) directly outputs the prospective distortion compensation coefficient to the selector 206(0).

When the saturation processing is performed on the distortion compensation coefficient, the clipper 204(0) outputs a signal "1" to the update controller 202 as the coefficient saturation information, and when the saturation processing is not performed on the distortion compensation coefficient, the clipper 204(0) outputs a signal "0" as the coefficient saturation information. That is, when the amplitude of the prospective distortion compensation coefficient is smaller than or equal to the threshold TH, as illustrated in FIG. 7, the clipper 204(0) outputs "0" as the coefficient saturation information. On the other hand, when the amplitude of the prospective distortion compensation coefficient is larger than the threshold TH, the clipper 204(0) outputs "1" as the coefficient saturation information.

The distortion compensation coefficient output from the clipper 204(0), the current distortion compensation coefficient (i.e., the distortion compensation coefficient before being calculated by the update calculator 22), and the control signal output from the update controller 202 are input to the selector 206(0). In accordance with the control signal output from the update controller 202, the selector 206(0) selects one of the distortion compensation coefficient output from the clipper 204(0) and the current distortion compensation coefficient (i.e., the distortion compensation coefficient before being calculated by the update calculator 22). For example, the selector 206(0) receives the control signal indicating "0" or "1" output from the update controller 202, and when the control signal indicates "0", the selector 206(0) outputs the distortion compensation coefficient input from the clipper 204(0). On the other hand, when the control signal indicates "1", the selector 206(0) outputs the current distortion compensation coefficient (i.e., the distortion compensation coefficient before being calculated by the update calculator 22). Since the configurations of the LUT1 saturation processor 200(1) to the $LUT_N$ saturation processor 200(N) are similar to the configuration of the $LUT_0$ saturation processor 200(0), a description thereof is not given hereinafter.

The update controller 202 has a detector 208 and a calculator 210. The pieces of coefficient saturation information indicating whether or not the clippers 204 have performed the saturation processing on the corresponding distortion compensation coefficients are input from the LUT saturation processors 200 to the detector 208. On the basis of the pieces of coefficient saturation information for the distortion compensation coefficients in the LUTs 180, the detector 208 detects that the saturation processing has been performed on at least one of the prospective distortion compensation coefficients calculated by the update calculator 22.

For example, when the clipper 204 has performed the saturation processing on the distortion compensation coefficient, the coefficient saturation information indicating "1" is input from the corresponding LUT saturation processor 200 to the detector 208, and when the clipper 204 has not performed the saturation processing on the distortion compensation coefficient, the coefficient saturation information indicating "0" is input to the detector 208. The detector 208 calculates the total number of the values indicated by the pieces of coefficient saturation information received from the LUT saturation processors 200. When the total number of the values is "0", the detector 208 detects that the clipper 204 in any of the LUT saturation processors 200 has not performed the saturation processing. On the other hand, when the total number of the values indicated by the pieces of coefficient saturation information received from the LUT saturation processors 200 is "1", the detector 208 detects that the clipper(s) 204 in at least one of the LUT saturation processors 200 has performed the saturation processing. When the total number of the values indicated by the pieces of coefficient saturation information received from the LUT saturation processors 200 is "1" or larger, the detector 208 output a total-number signal indicating "1".

When the detector 208 detects that the saturation processing has been performed on at least one of the distortion compensation coefficients, the calculator 210 causes the current distortion compensation coefficients (i.e., the distortion compensation coefficients before being calculated by the update calculator 22) to be selected and output from the LUT saturation processors 200. For example, when the total-number signal output from the detector 208 indicates "0", the calculator 210 calculates that any of the LUT saturation processors 200 has not performed the saturation processing and outputs the control signal indicating "0". When the total-number signal output from the detector 208 indicates "1", the calculator 210 calculates that at least one of the LUT saturation processors 200 has performed the saturation processing and outputs the control signal indicating "1". When the control signal output from the calculator 210 indicates "0", the corresponding selector 206 outputs the distortion compensation coefficient input from the clipper 204. On the other hand, when the control signal indicates "1", the corresponding selector 206 outputs the current distortion compensation coefficient (i.e., the distortion compensation coefficient before being calculated by the update calculator 22).

Figure 8:
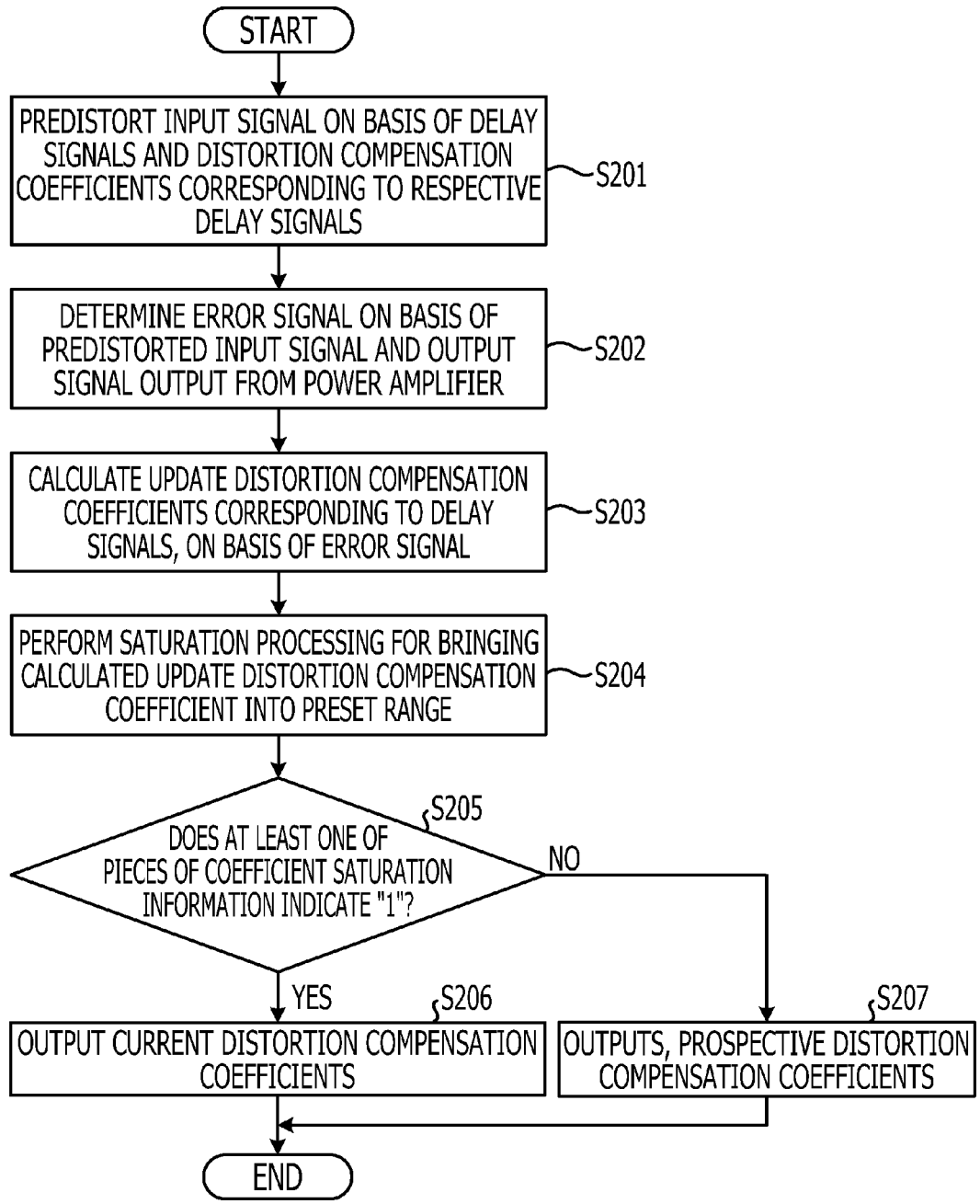
FIG. 8 is a flowchart of the processing of a distortion compensation device according to the second embodiment.

Processing of the distortion compensation device according to the second embodiment will be described next. FIG. 8 is a flowchart of the processing of the distortion compensation device according to the second embodiment. As illustrated in FIG. 8, first, in step S201, the predistortion-signal generator 16 predistorts an input signal on the basis of delay signals and distortion compensation coefficients corresponding to the respective delay signals, the delay signals being obtained by applying different amounts of delay to the input signal. In step S202, the subtractor 44 calculates an error signal on the basis of the input signal predistorted in step S201 and an output signal from the power amplifier 30 that amplifies the predistorted input signal. In step S203, on the basis of the error signal calculated in step S202, the update calculator 22 calculates prospective distortion compensation coefficients corresponding to the delay signals obtained by applying the different amounts of delay to the input signal.

In step S204, the LUT saturation processors 200 perform saturation processing for bringing the prospective distortion compensation coefficients, calculated in step S203, into a preset range. In step S205, the detector 208 detects whether or not at least one of the pieces of coefficient saturation information indicating whether or not the saturation processing has been performed on the prospective distortion compensation coefficients calculated in step S203 indicates "1". When at least one of the pieces of coefficient saturation information indicates "1" (Yes in step S205), the process proceeds to step S206 in which the calculator 210 outputs, to the selector 206, the control signal "1" for outputting the current distortion compensation coefficients and the selectors 206 outputs the current distortion compensation coefficients. When any of the pieces of coefficient saturation information does not indicate "1" (No in step S205), the process proceeds to step S207 in which the calculator 210 outputs, to the selectors 206, the control signal "0" for outputting the prospective distortion compensation coefficients and the selector 206 outputs the prospective distortion compensation coefficients.

According to the second embodiment, it is possible to suppress degradation of the performance of distortion compensation caused by the saturation processing on the distortion compensation coefficients. That is, only when the distortion compensation coefficients in all of the LUTs 180 are not saturated, the distortion compensation device according to the second embodiment may write the prospective distortion compensation coefficients to the LUTs 180. In addition, when the saturation compensation coefficient(s) in at least one of the LUTs 180 is saturated, the distortion compensation device according to the second embodiment may disable the updating of the distortion compensation coefficients by writing the current distortion compensation coefficients to the LUTs 180. As described above, rather than performing independent saturation processing on the distortion compensation coefficients in the LUTs 180, the distortion compensation device according to the second embodiment monitors saturation of the distortion compensation coefficients in the LUTs 180 and controls the saturation processing for the distortion compensation coefficients in the LUTs 180 on the basis of information resulting from the saturation monitoring. According to the distortion compensation device of the second embodiment, since the LUT saturation processors 200 are controlled based on the pieces of coefficient saturation information collected from the LUTs 180, saturation of the distortion compensation coefficient in one LUT does not disorderly affect the other LUTs. As a result, the distortion compensation device according to the second embodiment may suppress deterioration of the performance of distortion compensation during saturation of the distortion compensation coefficients. The method for disabling the updating of the distortion compensation coefficients is not limited to the method described in the second embodiment. One exemplary method is a method in which the control signal is used as a LUT write-control signal (a write enable signal) to disable writing of the distortion compensation coefficients to the LUTs 180 in only a period of time in which the updating is to be disabled.

Third Embodiment

Figure 9:
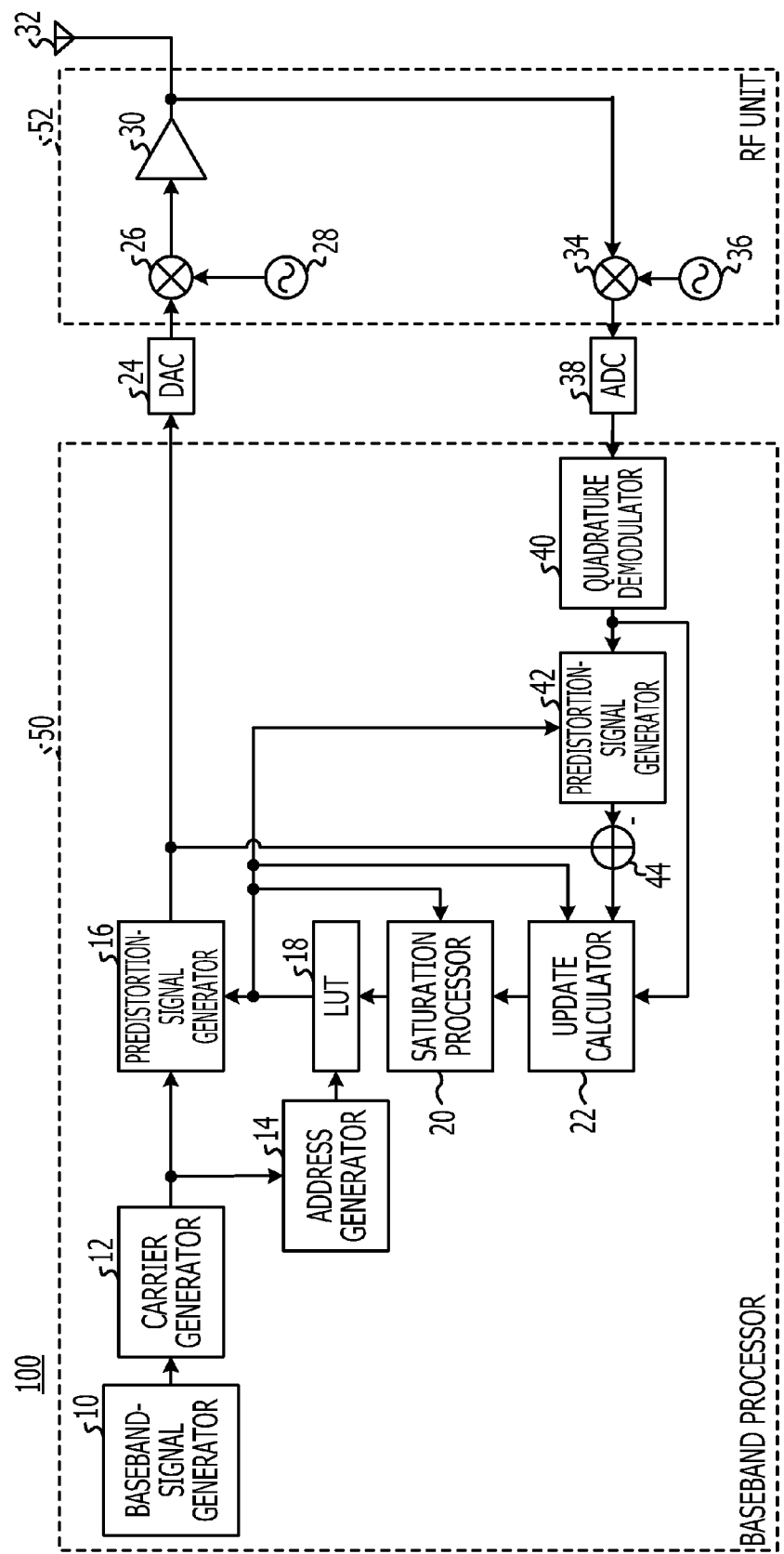
FIG. 9 is a diagram illustrating an overall configuration of a transmitter according to a third embodiment.
Figure 10:
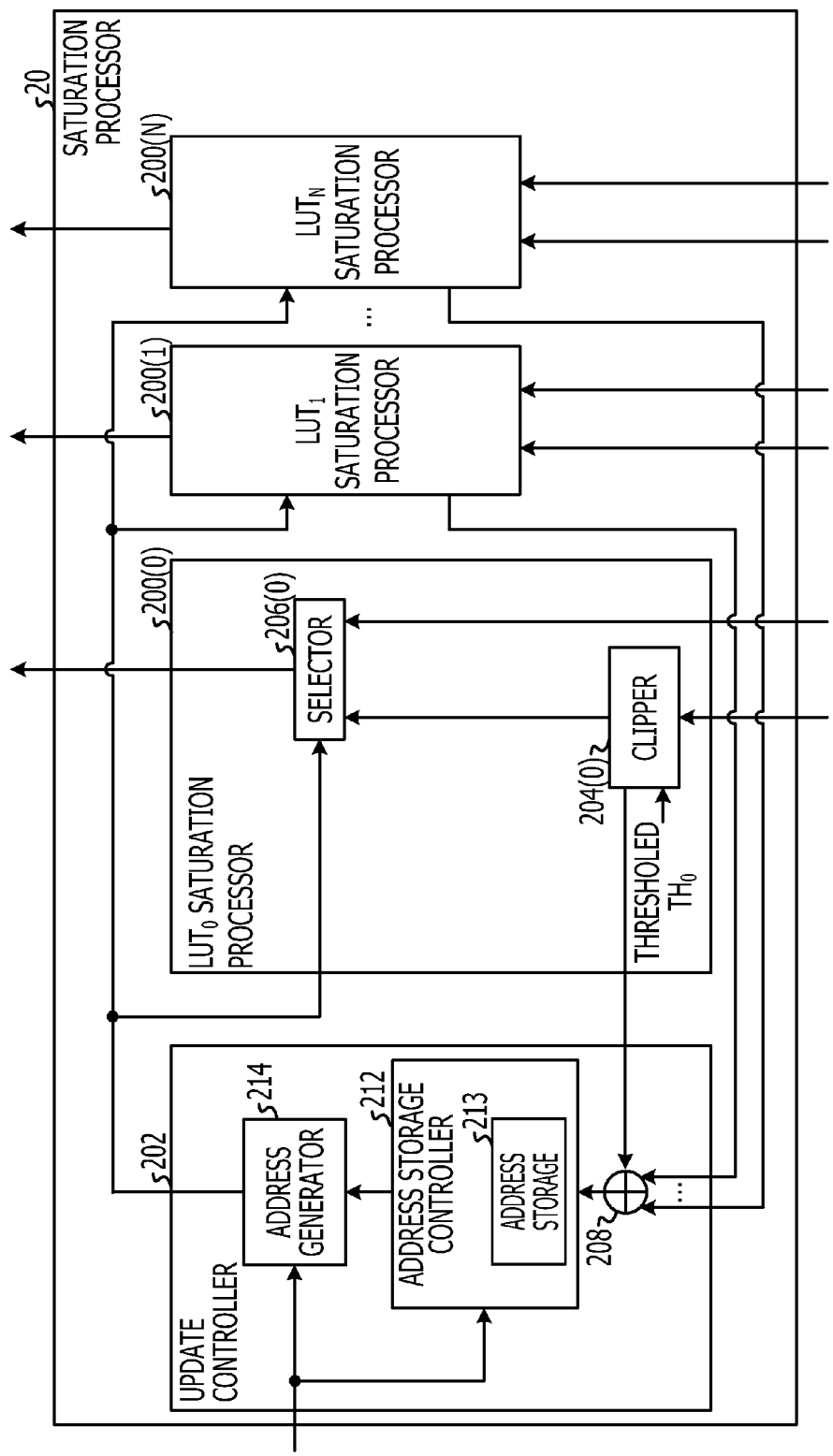
FIG. 10 is a diagram illustrating the configuration of a saturation processor in the transmitter according to the third embodiment.

A transmitter according to a third embodiment will be described next. FIG. 9 is a diagram illustrating an overall configuration of a transmitter according to a third embodiment. FIG. 10 is a diagram illustrating the configuration of a saturation processor in the transmitter according to the third embodiment. The configuration of the transmitter according to the third embodiment is similar to the configuration of the transmitter according to the first embodiment, except that the configuration of the saturation processor 20 is different and the LUT address value a(t) output from the LUT 18 is input to the saturation processor 20, as illustrated in FIGS. 9 and 10. Thus, descriptions of the similar configurations are not given hereinafter. Also, since the configuration of the LUT saturation processors 200 is similar to the configuration of those in the second embodiment, as illustrated in FIG. 10, a description thereof is not given hereinafter.

The update controller 202 has a detector 208, an address storage controller 212, and an address generator 214. The value a(t) of a LUT address at which the distortion compensation coefficient $LUT_0\{a(t)\}$ for the input signal x(t) to which the amount of delay is not applied is stored is periodically input to the address storage controller 212 and the address generator 214. The pieces of coefficient saturation information indicating whether or not the clippers 204 have performed the saturation processing on the corresponding distortion compensation coefficients are input from the LUT saturation processors 200 to the detector 208. On the basis of the pieces of coefficient saturation information for the distortion compensation coefficients in the LUTs 180, the detector 208 detects that the saturation processing has been performed on at least one of the prospective distortion compensation coefficients calculated by the update calculator 22.

For example, when the clipper 204 has performed the saturation processing on the distortion compensation coefficient, the coefficient saturation information indicating "1" is input from the corresponding LUT saturation processor 200 to the detector 208, and when the clipper 204 has not performed the saturation processing on the distortion compensation coefficient, the coefficient saturation information indicating "0" is input to the detector 208. The detector 208 calculates the total number of the values indicated by the pieces of coefficient saturation information received from the LUT saturation processors 200. When the total number of the values is "0", the detector 208 detects that the clipper 204 in any of the LUT saturation processors 200 has not performed the saturation processing. On the other hand, when the total number of the values indicated by the pieces of coefficient saturation information received from the LUT saturation processors 200 is "1", the detector 208 detects that the clipper(s) 204 in at least one of the LUT saturation processors 200 has performed the saturation processing. When the total number of the values indicated by the pieces of coefficient saturation information received from the LUT saturation processors 200 is "1" or larger, the detector 208 outputs "1".

The address storage controller 212 has an address storage 213 in which the LUT address values are stored. For convenience of description, a description below is given assuming that the address value stored in the address storage 213 is a(u). When the detector 208 detects that the saturation processing has been performed on at least one of the distortion compensation coefficients, the address storage controller 212 compares the LUT address value a(u) stored in the address storage 213 with the LUT address value a(t) input to the address storage controller 212. In other words, when the total number of the values indicated by the pieces of coefficient saturation information output from the detector 208 is "1", the address storage controller 212 compares the LUT address value a(u) stored in the address storage 213 with the LUT address value a(t) input to the address storage controller 212.

When the LUT address value a(t) is smaller than the LUT address value a(u), the address storage controller 212 overwrites the LUT address value a(u) with the LUT address value a(t). That is, the address storage controller 212 overwrites the LUT address value, stored in the address storage 213, with a(t). The address storage controller 212 outputs the LUT address value, stored in the address storage 213, to the address generator 214. When the LUT address value a(t) is smaller than the LUT address value a(u), the LUT address value a(t) is stored in the address storage 213. On the other hand, when the LUT address value a(t) is larger than or equal to the LUT address value a(u), the LUT address value a(u) is stored unchanged in the address storage 213. With this arrangement, the LUT address value stored in the address storage 213 is the smallest address value obtained when the saturation of the distortion compensation coefficient in any of the LUTs 180 was previously detected. For convenience of description, a description below will be given assuming that a LUT address value a(u') is stored in the address storage 213. In addition, for convenience of description, a description will be given assuming that a LUT address value a(t') is input to the address generator 214 as the value of the LUT address at which the distortion compensation coefficient for the input signal to which the amount of delay is not applied is stored.

For each control time at which the prospective distortion compensation coefficient is calculated, the address generator 214 compares the LUT address value a(u') stored in the address storage 213 with the LUT address value a(t') input to the address generator 214. When the LUT address value a(t') is smaller than the LUT address value a(u'), the address generator 214 causes the prospective distortion compensation coefficients calculated by the update calculator 22 to be selected and output from the LUT saturation processors 200.

For example, when the LUT address value a(t') is smaller than the LUT address value a(u'), the address generator 214 outputs a control signal indicating "0". On the other hand, for example, when the LUT address value a(t') is larger than or equal to the LUT address value a(u'), the address generator 214 outputs a control signal indicating "1". When the control signal output from the address generator 214 indicates "0", each selector 206 outputs the distortion compensation coefficient input from the clipper 204. On the other hand, when the control signal indicates "1", each selector 206 outputs the current distortion compensation coefficient (i.e., the distortion compensation coefficient before being calculated by the update calculator 22).

Processing of the distortion compensation device according to the third embodiment will be described next. FIG. 11 is a flowchart of the processing of the distortion compensation device according to the third embodiment. As illustrated in FIG. 11, first, in step S301, the predistortion-signal generator 16 predistorts an input signal on the basis of delay signals and distortion compensation coefficients corresponding to the respective delay signals, the delay signals being obtained by applying different amounts of delay to the input signal. In step S302, the subtractor 44 calculates an error signal on the basis of the input signal predistorted in step S301 and an output signal from the power amplifier 30 that amplifies the predistorted input signal. In step S303, on the basis of the error signal calculated in step S302, the update calculator 22 calculates prospective distortion compensation coefficients corresponding to the delay signals obtained by applying the different amounts of delay to the input signal.

In step S304, the LUT saturation processors 200 perform saturation processing for bringing the prospective distortion compensation coefficients, calculated in step S303, into a preset range. In step S305, the detector 208 detects whether or not at least one of the pieces of coefficient saturation information indicating whether or not the saturation processing has been performed on the prospective distortion compensation coefficients calculated in step S203 indicates "1". When at least one of the pieces of saturation coefficient information indicates "1" (Yes in step S305), the process proceeds to step S306 in which the address storage controller 212 determines whether or not the LUT address value a(t) is smaller than the LUT address value a(u). When the LUT address value a(t) is smaller than the LUT address value a(u) (Yes in step S306), the process proceeds to step S307 in which the address storage controller 212 stores the LUT address value a(t) in the address storage 213.

When the result of the determination in step S305 is No, when the result of the determination in step S306 is No, or when the processing in step S307 is completed, the process proceeds to step S308 in which the address generator 214 determines whether or not the LUT address value a(t') is smaller than the LUT address value a(u'). When the LUT address value a(t') is smaller than the LUT address value a(u') (Yes in step S308), the process proceeds to step S309 in which the address generator 214 outputs, to the selector 206, the control signal "0" for outputting the prospective distortion compensation and the selector 206 outputs the prospective distortion compensation coefficient. On the other hand, when the LUT address value a(t') is not smaller than the LUT address value a(u') (No in step S308), the process proceeds to step S310 in which the address generator 214 outputs, to the selector 206, the control signal "1" for outputting the current distortion compensation coefficient and the selector 206 outputs the current distortion compensation coefficient.

According to the third embodiment, it is possible to suppress degradation of the performance of distortion compensation caused by the saturation processing of the distortion compensation coefficients. That is, when the distortion compensation coefficient(s) in at least one of the LUTs 180 is saturated, the distortion compensation device of the third embodiment compares the value a(t) of the LUT address at which the $LUT_0$ distortion compensation coefficient is stored with the LUT address value a(u) stored in the address storage 213. In the distortion compensation device of the third embodiment, when the LUT address value a(t) is smaller than the LUT address value a(u), the LUT address value a(t) is stored in the address storage 213. Thus, according to the distortion compensation device of the third embodiment, the smallest LUT address value obtained when the saturation of the distortion compensation coefficient in any of the LUTs 180 was previously detected is stored in the address storage 213. According to the distortion compensation device of the third embodiment, only when the LUT address value a(t') is smaller than the LUT address value a(u'), each LUT saturation processor 200 outputs the prospective distortion compensation coefficient, and otherwise, each LUT saturation processor 200 outputs the current distortion compensation coefficient for disabling the updating of the distortion compensation coefficient. Thus, according to the third embodiment, it is possible to realize saturation processing that enables the updating of the distortion compensation coefficients at only a smaller address than the address at which the saturation of the distortion compensation coefficient in any of the LUTs was previously detected.

As described above, rather than performing independent saturation processing on the distortion compensation coefficients in the LUTs 180, the distortion compensation device according to the third embodiment monitors saturation of the distortion compensation coefficients in the LUTs 180 and controls the saturation processing of the distortion compensation coefficients in the LUTs 180 on the basis of information resulting from the saturation monitoring. According to the distortion compensation device according to the third embodiment, since the LUT saturation processors 200 are controlled based on the pieces of coefficient saturation information collected from the LUTs 180, saturation of the distortion compensation coefficient in one LUT does not disorderly affect the other LUTs. As a result, the distortion compensation device according to the third embodiment may suppress deterioration of the performance of distortion compensation during saturation of the distortion compensation coefficients. The scheme for disabling the updating of the distortion compensation coefficients is not limited to the scheme described in the third embodiment. One exemplary method is a method in which the control signal is used as a LUT write-control signal (a write enable signal) to disable writing of the distortion compensation coefficients to the LUTs 180 in only a period of time in which the updating is to be disabled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device comprising:
    a distortion compensator that predistorts an input signal based on delay signals and distortion compensation coefficients corresponding to the respective delay signals, the delay signals being obtained by applying different amounts of delay to the input signal;
    a calculator that calculates an error signal based on the predistorted input signal and an output signal from an amplifier that amplifies the predistorted input signal;
    a calculator that calculates prospective distortion compensation coefficients for updating the distortion compensation coefficients, based on the error signal;
    a saturation processor that performs saturation processing for, when at least one of the prospective distortion compensation coefficients does not fall into a preset range corresponding to the at least one prospective distortion compensation, changing the at least one prospective distortion compensation coefficient to a value within the preset range; and
    a controller that controls the updating of the distortion compensation coefficients based on pieces of coefficient saturation information indicating whether or not the saturation processing is performed on the prospective distortion compensation coefficients.

2. The distortion compensation device according to claim 1, wherein, based on the pieces of coefficient saturation information for the prospective distortion compensation coefficients,
    the controller updates the distortion compensation coefficients with the prospective distortion compensation coefficients or disables the updating of the distortion compensation coefficients with the prospective distortion compensation coefficients.

3. The distortion compensation device according to claim 2, wherein the controller includes:
    a detector that detects that the saturation processing is performed on at least one of the prospective distortion compensation coefficients, based on the pieces of coefficient saturation information for the prospective distortion compensation coefficients; and
    a calculator that disables the updating of the distortion compensation coefficients with the prospective distortion compensation coefficients, when the detector detects that the saturation processing is performed on at least one of the prospective distortion compensation coefficients.

4. The distortion compensation device according to claim 2, further comprising:
    look-up tables in which the distortion compensation coefficients are stored;
    an address generator that generates, for the look-up tables, values of addresses at which the distortion compensation coefficients are stored, in accordance with amplitude of the input signal; and
    an address storage that stores the determined look-up-table address values, wherein the controller includes
    a detector that detects that the saturation processing is performed on at least one of the prospective distortion compensation coefficients, an address storage controller that compares, when the detector detects that the saturation processing is performed on at least one of the distortion compensation coefficients, the first stored look-up-table address value with the second look-up-table address value at which the distortion compensation coefficient for the input signal to which the amount of delay is not applied is stored and that overwrites, when the second look-up address value is smaller than the first look-up-table address value, the first look-up-table address value with the second lookup-table address value, and
    an address generator that compares the third look-up-table address value stored in the address storage with the fourth look-up-table address value at which the distortion compensation coefficient for the input signal to which the amount of delay is not applied is stored and that updates, when the fourth look-up-table address value is smaller than the third look-up-table address value, the distortion compensation coefficients with the prospective distortion compensation coefficients.

5. A transmitter comprising:
    a radio-frequency circuit that converts a baseband signal into a radio-frequency signal, that amplifies the radiofrequency signal, and that transmits the amplified radiofrequency signal via an antenna; and
    a processor that executes processing including
    predistorting the baseband signal based on delay signals and distortion compensation coefficients corresponding to the respective delay signals, the delay signals being obtained by applying different amounts of delay to the baseband signal,
    calculating an error signal based on the predistorted baseband signal and an output signal from an amplifier that amplifies the predistorted baseband signal,
    calculating prospective distortion compensation coefficients for updating the distortion compensation coefficients, based on the error signal,
    performing saturation processing for, when at least one of the prospective distortion compensation coefficients does not fall into a preset range corresponding to the at least one prospective distortion compensation, changing the at least one prospective distortion compensation coefficient to a value within the preset range, and
    controlling the updating of the distortion compensation coefficients based on pieces of coefficient saturation information indicating whether or not the saturation processing is performed on the prospective distortion compensation coefficients.

6. The transmitter according to claim 5, wherein, based on the pieces of coefficient saturation information for the prospective distortion compensation coefficients, the processor executes processing for updating the distortion compensation coefficients with the prospective distortion compensation coefficients or disabling the updating of the distortion compensation coefficients with the prospective distortion compensation coefficients.

7. The transmitter according to claim 6, wherein the processor executes processing including detecting that the saturation processing is performed on at least one of the prospective distortion compensation coefficients, based on the pieces of coefficient saturation information for the prospective distortion compensation coefficients; and disabling the updating of the distortion compensation coefficients with the prospective distortion compensation coefficients, when it is detected that the saturation processing is performed on at least one of the prospective distortion compensation coefficients.

8. The transmitter according to claim 6, further comprising:

memories in which the distortion compensation coefficients are stored;
a plurality of memory in which values of addresses at which the distortion compensation coefficients are stored are stored, in accordance with amplitude of the baseband signal, the addresses being included in the plurality of memories,
wherein the processor detects that the saturation processing is performed on at least one of the prospective distortion compensation coefficients;
upon detecting that the saturation processing is performed on at least one of the distortion compensation coefficients;
the processor compares the first stored address value with the second address value at which the distortion compensation coefficient for the baseband signal to which the amount of delay is not applied is stored, and when the second address value is smaller than the first address value, the processor overwrites the first address value with the second address value; and
the processor compares the stored third address value with the fourth address value at which the distortion compensation coefficient for the baseband signal to which the amount of delay is not applied is stored, and when the fourth address value is smaller than the third address value, the processor executes processing for updating the distortion compensation coefficients with the prospective distortion compensation coefficients.

9. A distortion compensation method comprising:
predistorting an input signal based on delay signals and distortion compensation coefficients corresponding to the respective delay signals, the delay signals being obtained by applying different amounts of delay to the input signal;
calculating an error signal based on the predistorted input signal and an output signal from an amplifier that amplifies the predistorted input signal;
calculating prospective distortion compensation coefficients for updating the distortion compensation coefficients, based on the error signal;
performing saturation processing for, when at least one of the prospective distortion compensation coefficients does not fall into a preset range corresponding to the at least one prospective distortion compensation, changing the at least one prospective distortion compensation coefficient to a value within the preset range; and
controlling, with a processor, the updating of the distortion compensation coefficients based on pieces of coefficient saturation information indicating whether or not the saturation processing is performed on the prospective distortion compensation coefficients.

10. The distortion compensation method according to claim 9, wherein, based on the pieces of coefficient saturation information for the prospective distortion compensation coefficients, the controlling updates the distortion compensation coefficients with the prospective distortion compensation coefficients or disables the updating of the distortion compensation coefficients with the prospective distortion compensation coefficients.

11. The distortion compensation method according to claim 10, wherein the controlling includes: detecting that the saturation processing is performed on at least one of the prospective distortion compensation coefficients, based on the pieces of coefficient saturation information for the prospective distortion compensation coefficients; and disabling, when it is detected that the saturation processing is performed on at least one of the prospective distortion compensation coefficients, the updating of the distortion compensation coefficients with the prospective distortion compensation coefficients.

12. The distortion compensation method according to claim 10, further comprising:
storing the distortion compensation coefficients in look-up tables;
generating, for the look-up tables, values of addresses at which the distortion compensation coefficients are stored, in accordance with amplitude of the input signal; and
storing the generated look-up-table address values in an address storage,
wherein the controlling includes detecting that the saturation processing is performed on at least one of the prospective distortion compensation coefficients, comparing, when it is detected that the saturation processing is performed on at least one of the distortion compensation coefficients, the first stored look-up-table address value stored in the address storage with the second look-up-table address value at which the distortion compensation coefficient for the input signal to which the amount of delay is not applied is stored and overwriting, when the second look-up address value is smaller than the first look-up-table address value, the first look-up-table address value with the second lookup-table address value, and comparing the third look-up-table address value stored in the address storage with the fourth look-up-table address value at which the distortion compensation coefficient for the input signal to which the amount of delay is not applied is stored and updating, when the fourth look-uptable address value is smaller than the third look-uptable address value, the distortion compensation coefficients with the prospective distortion compensation coefficients.

\* \* \* \* \*